(12) United States Patent
Hiyama

(10) Patent No.: US 11,545,986 B2
(45) Date of Patent: Jan. 3, 2023

(54) PHASE LOCKING CIRCUIT

(71) Applicant: RENESAS ELECTRONICS CORPORATION, Tokyo (JP)

(72) Inventor: Naoaki Hiyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/540,938

(22) Filed: Dec. 2, 2021

(65) Prior Publication Data

US 2022/0200609 A1 Jun. 23, 2022

(30) Foreign Application Priority Data

Dec. 22, 2020 (JP) .............................. JP2020-212080

(51) Int. Cl.
*H03L 7/099* (2006.01)
*H03L 7/081* (2006.01)
*H03L 7/089* (2006.01)

(52) U.S. Cl.
CPC ............ *H03L 7/0995* (2013.01); *H03L 7/081* (2013.01); *H03L 7/0891* (2013.01)

(58) Field of Classification Search
CPC ...... H03L 7/0995; H03L 7/081; H03L 7/0891
See application file for complete search history.

(56) References Cited

U.S. PATENT DOCUMENTS 6,154,071 A * 11/2000 Nogawa ................ H03L 7/0891
327/147
6,456,129 B1 * 9/2002 Tsukude .................. H03L 7/093
327/158
6,701,445 B1 * 3/2004 Majos ..................... H04L 7/033
327/156
7,327,195 B2 * 2/2008 Sawada ................. H03L 7/0898
331/34
8,917,126 B1 * 12/2014 Ficke .................... G06F 1/3237
327/157
10,879,914 B1 * 12/2020 Jung ......................... H03L 7/18
(Continued)

FOREIGN PATENT DOCUMENTS

KR 20180115204 A * 10/2018

OTHER PUBLICATIONS

X. Gao et al., "Jitter Analysis and a Benchmarking Figure-of-Merit for Phase-Locked Loops", IEEE Transactions on Circuits and Systems—II, vol. 56, No. 2, pp. 117-121, Feb. 2009.

*Primary Examiner* — Adam D Houston
(74) *Attorney, Agent, or Firm* — McDermott Will & Emery LLP

(57) ABSTRACT

A phase locking circuit includes: a phase comparator; a pulse generation circuit; a charge pump circuit; a loop filter circuit; and a voltage-controlled oscillator. The phase comparator samples a first level in synchronization with a received reference clock, and generates a first signal to be initialized to a second level that is different from the first level by using a feedback clock. The pulse generation circuit generates a second signal in accordance with the reference clock, and controls a phase of as output signal of the voltage-controlled oscillator to be the feedback clock to have a predetermined value by inputting the first signal and the second signal as a control voltage to the voltage-controlled oscillator through the charge pump circuit and the loop filter circuit.

5 Claims, 8 Drawing Sheets

(56) References Cited

U.S. PATENT DOCUMENTS

| | | | | |
|---|---|---|---|---|
| 2008/0116983 | A1* | 5/2008 | Kinugasa | H03L 7/095 |
| | | | | 331/25 |
| 2009/0015338 | A1* | 1/2009 | Frey | H03L 7/1976 |
| | | | | 327/156 |
| 2010/0134158 | A1* | 6/2010 | Pignol | H04L 7/0276 |
| | | | | 327/156 |
| 2010/0321074 | A1* | 12/2010 | Song | H03L 7/1072 |
| | | | | 327/156 |
| 2011/0181327 | A1* | 7/2011 | Shiobara | H03L 7/183 |
| | | | | 327/156 |
| 2012/0242384 | A1* | 9/2012 | Kato | H03L 7/1974 |
| | | | | 327/157 |
| 2014/0021987 | A1* | 1/2014 | Okada | H03L 7/083 |
| | | | | 327/156 |
| 2015/0222278 | A1* | 8/2015 | Reichelt | H03L 7/102 |
| | | | | 327/156 |
| 2016/0112055 | A1* | 4/2016 | Mirajkar | H03L 7/1077 |
| | | | | 327/158 |
| 2021/0313995 | A1* | 10/2021 | Zuo | H04L 7/033 |
| 2022/0190833 | A1* | 6/2022 | Moslehi Bajestan | H03M 3/322 |
| 2022/0200609 | A1* | 6/2022 | Hiyama | H03L 7/081 |

\* cited by examiner

PHASE LOCKING CIRCUIT

CROSS-REFERENCE TO RELATED APPLICATION

The disclosure of Japanese Patent Application No. 2020-212080 filed on Dec. 22, 2020, including the specification, drawings and abstract is incorporated herein by reference in its entirety.

BACKGROUND

The present invention relates to a technique effectively applied to a phase locking circuit.

As shown in FIG. 1, a phase locking circuit (PLL: phase locked loop) includes a phase-frequency comparison circuit (also referred to as phase comparator) "PFD" (Phase-Frequency Detector), a charge pump circuit "CP" (Charge Pump), a loop filter circuit "Filter" having a frequency multiplying factor of "N", a voltage-controlled oscillation circuit "VCO" (Voltage-Controlled Oscillator) and a frequency division circuit "DIV" (Divider). The phase-frequency comparison circuit PFD compares a phase and a frequency between a reference input signal INPUT having a reference frequency "fn" and a feedback signal "FEEDBACK" output from the frequency division circuit DIV, and generates an up signal UP or a down signal DN so that the phase and the frequency of the feedback signal FEEDBACK and the phase and the frequency of the input signal INPUT match with each other. The charge pump circuit CP generates a voltage output signal "VCP" based on the up signal "UP" or the down signal "DN", and outputs this signal to the loop filter circuit Filter. The voltage-controlled oscillation circuit VCO generates an output signal "OUTPUT" having a frequency "fout" (=N×fn) that is n times the reference frequency fn in accordance with a voltage control signal "VCNT" output from the loop filter circuit Filter. A frequency of the output signal OUTPUT is divided to be 1/N times the frequency by the frequency division circuit DIV, and is input as the feedback signal FEEDBACK to the phase-frequency comparison circuit PFD.

There is disclosed a technique listed below.

[Non-Patent Document 1] X. Gao, E. Klumperink, P. J. F. Geraedts and B. Nauta, "Jitter Analysis and a Benchmarking Figure-of-Merit for Phase-locked Loops", IEEE Trans. Circuits Syst. II, vol. 56, no. 2, pp. 117 to 121, February 2009

SUMMARY

A semiconductor product for energy harvest needs to include a circuit having low power consumption as low as possible. In the phase locking circuit PLL of FIG. 1, a consumed electric current of the frequency division circuit DIV operating at a frequency of the voltage-controlled oscillation circuit VCO is large. About thirty percent of the entire consumed electric current of the phase locking circuit PLL is the consumed electric current of the frequency division circuit DIV.

As a method of reducing the consumed electric current of the frequency division circuit DIV, a method of removing the frequency division circuit DIV by usage of a Sub-Sampling PLL is exemplified. By usage of the Sub-Sampling PLL to directly detect an output phase of the voltage-controlled oscillation circuit VCO, the normally operating Sub-Sampling PLL can be configured even in the case of the removal of the frequency division circuit DIV. The Sub-Sampling PLL is a circuit assumed to be an LC oscillator, and is not applied to be used for a semiconductor product for energy harvest operating at several tens of MHz because of having a large area.

As the oscillator of the phase locking circuit PLL operating at several tens of MHz, a Ring oscillator is mainly used. However, there is no phase locking circuit PLL being able to be made of the Ring oscillator without the frequency division circuit DIV. In order to prepare the LC oscillator operating at several tens of MHz, an area that is 4000 times as large as an area of the Ring oscillator is necessary.

An object of the present invention is to provide a technique capable of reducing a consumed electric current while suppressing increase in an area of a phase locking circuit embedded in a semi conductor device.

Other objects and novel characteristics will be apparent from the description of the present specification and the accompanying drawings.

The summary of the typical aspects of the inventions disclosed in the present application will be briefly described as follows.

According to an embodiment, a phase locking circuit includes a phase comparator, a pulse generation circuit, a charge pump circuit, a loop filter circuit and a voltage-controlled oscillator. The phase comparator samples a first level in synchronization with a received reference clock, and generates a first signal to be initialized to a second level that is different from the first level by using a feedback clock. The pulse generation circuit generates a second signal in accordance with the reference clock, and controls a phase of an output signal of the voltage-controlled oscillator to be the feedback clock to have a predetermined value by inputting the first signal and the second signal as a control voltage to the voltage-controlled oscillator through the charge pump circuit and the loop filter circuit.

The phase locking circuit according to the embodiment can reduce the consumed electric current while suppressing the increase in the area.

BRIEF DESCRIPTIONS OF THE DRAWINGS

DETAILED DESCRIPTION

Hereinafter, examples will be explained with reference to the drawings. Note that the same components are denoted by the same reference symbols in the following explanation, and the repetitive explanation thereof will be omitted. In order to make the clear description, the drawings are illustrated to be more schematic than those in a practical aspect in some cases. However, the illustration is only an example, and does not limit the interpretation of the present invention.

Figure 1:
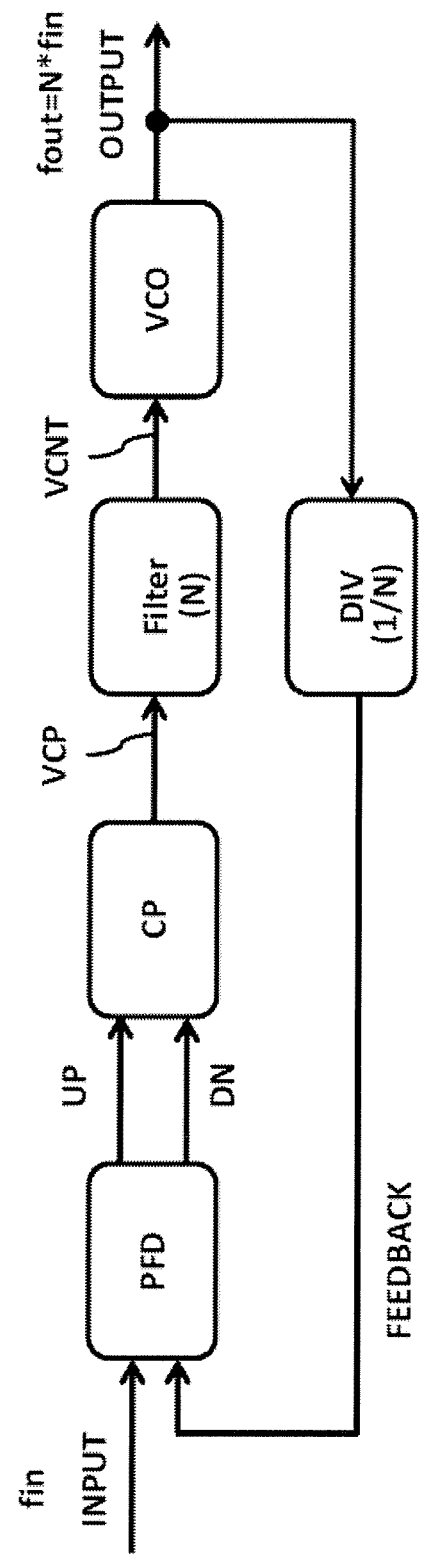
FIG. 1 is a block diagram showing a configuration example of a phase locking circuit.
Figure 2:
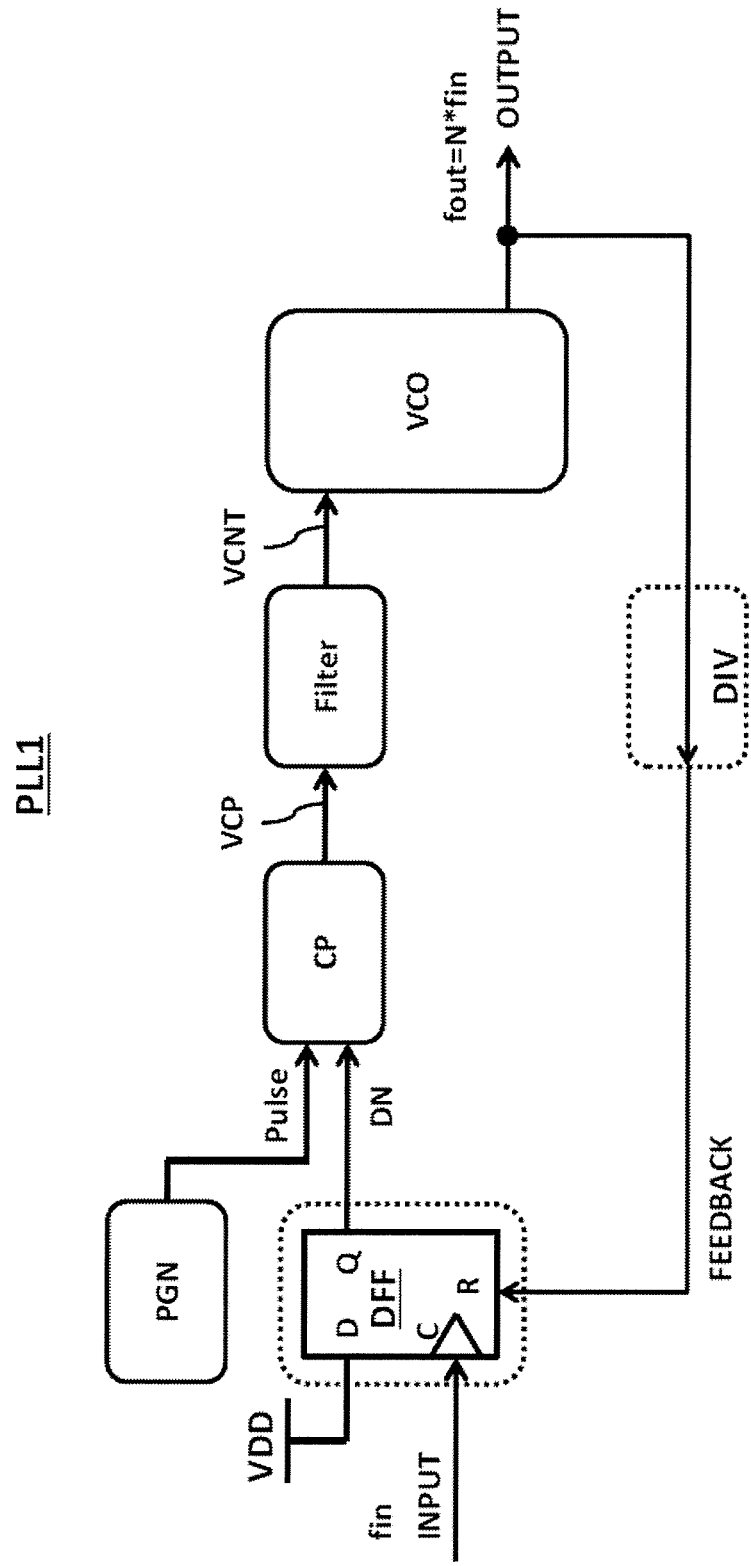
FIG. 2 is a block diagram showing a configuration example of a phase locking circuit according to a first example.

FIG. 2 is a block diagram showing a configuration example of a phase locking circuit according to a first example. A phase locking circuit PLL1 (PLL: phase locked loop) includes a delay flip flop (also referred to as D-type flip flop with Reset) "DFF", a pulse generation circuit (also referred to as pulse generator circuit) "PGN", a charge pump circuit CP, a loop filter circuit Filter having a multiplying factor of N and a voltage-controlled oscillation circuit (also referred to as voltage-controlled oscillator) VCO. In the phase locking circuit PLL1, in other words, in the phase locking circuit PLL1 of FIG. 2, the phase-frequency comparison circuit PFD of FIG. 1 is replaced with the delay flip flop DFF. In other words, the delay flip flop DFF operates as the phase-frequency comparison circuit (phase comparator). The frequency division circuit DIV (Divider) is removed. The phase locking circuit PLL1 is a phase locking circuit embedded in a semiconductor device, and is formed inside a semiconductor chip in which the semiconductor device is formed.

The delay flip flop OFF operating as the phase comparator has a clock terminal "C" to which the reference input signal INPUT having the reference frequency fn is input, an input terminal "D" to which a power-supply potential "VDD" is input, an output terminal"Q" from which the down signal DN is output to the charge pump circuit CP, and a reset terminal "R" to which an oscillation signal (VCO source oscillation (VCOSOF), output signal) OUTPUT of the voltage-controlled oscillation circuit VCO is input as the feedback signal FEEDBACK. The phases of the reference input signal INPUT and the output signal OUTPUT of the voltage-controlled oscillation circuit VCO are directly compared by the delay flip flop DFF. The reference input signal INPUT is a reference clock.

A pulse signal "Pulse" output from the pulse generation circuit PGN is output as the up signal UP to the charge pump circuit CP. The pulse generation circuit PGN outputs a pulse signal Pulse having a pulse waveform with certain pulse time width in synchronization with the reference input signal INPUT.

The charge pump circuit CP generates the voltage output signal VCP based on the pulse signal Pulse that is the up signal UP or the down signal DN, and outputs this signal to the loop filter circuit Filter. The voltage-controlled oscillation circuit VCO generates the output signal OUTPUT having the frequency fout (=N×fn) that is N times the reference frequency fn, based on The voltage control signal VCNT output from the loop filter circuit Filter. The output signal OUTPUT is input as The feedback signal FEEDBACK to the reset terminal R of the delay flip flop DFF. The feedback signal FEEDBACK can be also regarded as a feedback clock.

The delay flip flop DFF operating as the phase comparator samples the first level (that is a voltage level of the power-supply potential VDD of the input terminal D) in synchronization with the received reference clock INPUT, and generates the first signal (down signal DN) to be initialized to the second level (that is a voltage level of the ground potential GND) by using the feedback clock (feedback signal FEEDBACK). The pulse generation circuit PGN generates the second signal (pulse signal Pulse) based on the reference clock INPUT. The first signal (down signal DN) and the second signal (pulse signal Pulse) are input as the control voltage (voltage control signal VCNT) to the voltage-controlled oscillator (voltage-controlled oscillation circuit VCO) through the charge pump circuit CP and the loop filter circuit Filter. In this manner, the phase of the output signal of the voltage-controlled oscillator is controlled to have a predetermined value.

In the above-described configuration, the phase of the output signal OUTPUT of the voltage-controlled oscillation circuit VCO is directly detected by the delay flip flop DFF, and the phase locking circuit PLL1 without the frequency division circuit DIV (Divider) is configured. In other words, the phase locking circuit PLL1 can reduce the consumed electric current while suppressing the increase in the area, and therefore, is applicable to the semiconductor product for energy harvest operating at several tens of MHz.

By the input of the output clock of the Ring oscillator to be the reference input signal INPUT to the input terminal D of the delay flip flop DFF, the output phase of the Ring oscillator can be directly detected. Also to the phase locking circuit PLL1 using the Ring oscillator, the configuration without the frequency division circuit DIV is applicable. As an incidental effect of the removal of the frequency division circuit DIV, noises resulted from the charge pump circuit CP can be reduced.

Figure 3:
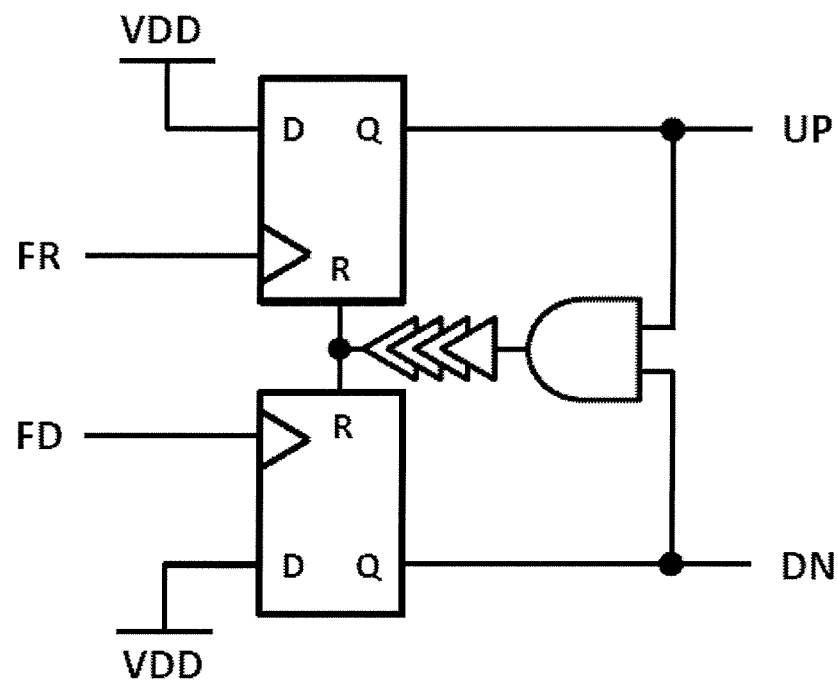
FIG. 3 is a circuit diagram showing a configuration example of a phase-frequency comparison circuit PFD.
Figure 4:
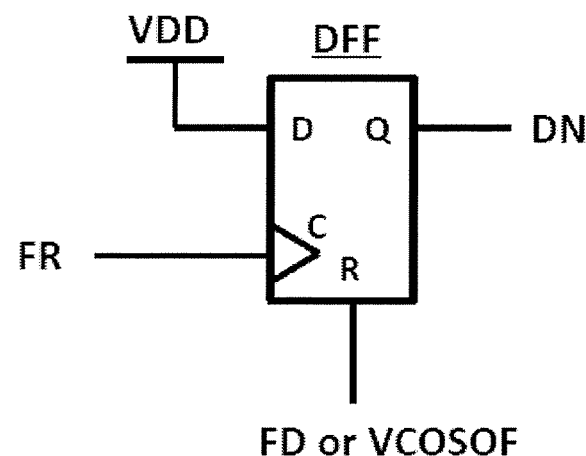
FIG. 4 is a circuit diagram showing a configuration example of a delay flip flop DFF of FIG. 2.

FIG. 3 is a circuit diagram showing a configuration example of the phase-frequency comparison circuit PFD. FIG. 4 is a circuit diagram showing a configuration example of the delay flip flop DFF of FIG. 2. In the phase locking circuit PLL1 of FIG. 2, the number of semiconductor elements can be reduced since the delay flip flop DFF of FIG. 2 is used in place of the phase-frequency comparison circuit PFD shown in FIG. 3. This is because the number of semiconductor elements configuring the delay flip flop DFF is smaller than the number of semiconductor elements configuring the phase-frequency comparison circuit PFD. Since the number of semiconductor elements configuring the phase locking circuit PLL1 can be made small, the consumed electric current of the phase locking circuit PLL1 can be also reduced.

Figure 5A:
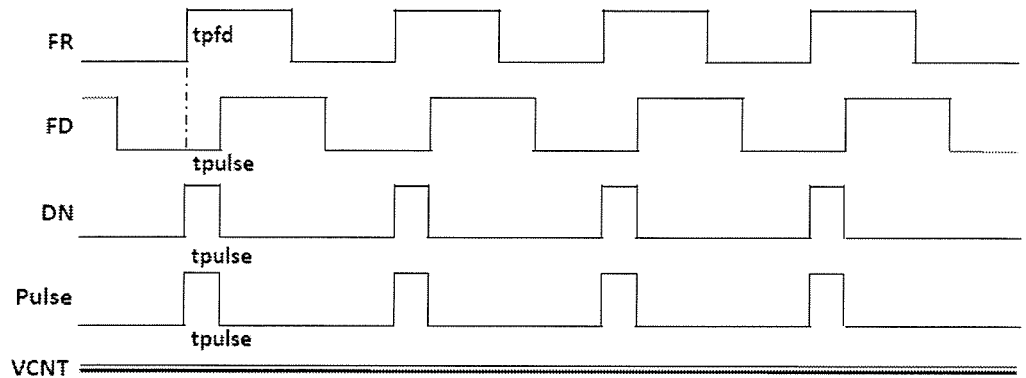
FIG. 5A is a waveform diagram showing an operation in a case of a loop made of only a down signal DN and showing a case of a constant voltage control signal VCNT.
Figure 5B:
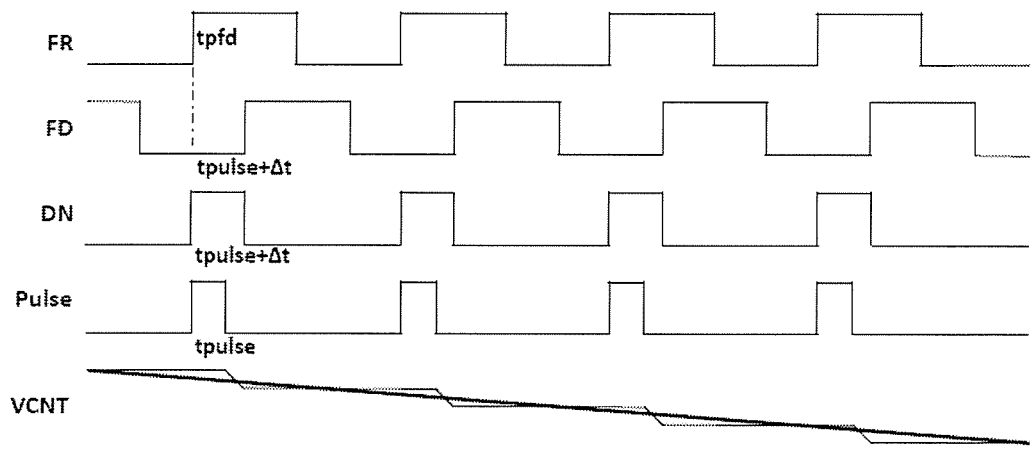
FIG. 5B is a waveform diagram showing an operation in a case of a loop made of only a down signal DN and showing a case of a decreasing voltage control signal VCNT.
Figure 5C:
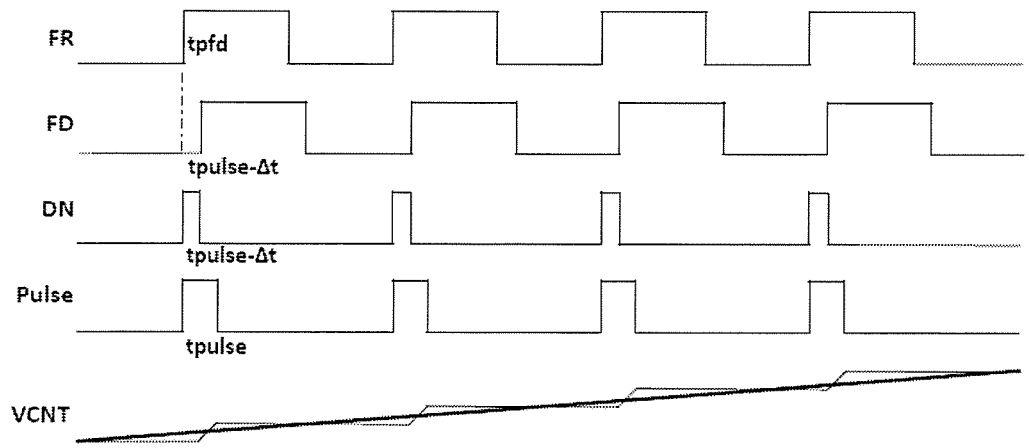
FIG. 5C is a waveform diagram showing an operation in a case of a loop made of only a down signal DN and showing a case of an increasing voltage control signal VCNT.

FIG. 5 is a waveform diagram showing an operation in a case of a loop made of only the down signal DN. FIG. 5 shows each of waveforms (FR, FD) on the clock terminal C and the reset terminal R of the relay flip flop DFF shown in FIG. 4, a waveform of the down signal DN, a waveform of the pulse signal Pulse and a waveform of the voltage control signal VCNT. And, FIG. 5A shows a case of a constant voltage control signal VCNT, FIG. 5B shows a case of a decreasing voltage control signal VCNT, and FIG. 5C shows a case of an increasing voltage control signal VCNT.

FIG. 5 shows a configuration of phase offset of the FR and the FD determined by a High width of the Pulse signal input from the pulse generation circuit PGN. When a feedback loop of the phase locking circuit PLL1 is made of only the down signal DN, the FD is configured to be necessarily later than the FR. The configuration is made so that the phase delay and the phase advancement are propagated to a later stage by change in the pulse width of the down signal DN. Therefore, when the feedback loop of the phase locking circuit PLL1 is made of only the down signal DN, the FD is necessarily later than the FR, and thus, the phase-frequency comparison circuit PFD shown in FIG. 3 can be replaced with the D-type flip flop DFF with Reset shown in FIG. 4.

Figure 6A:
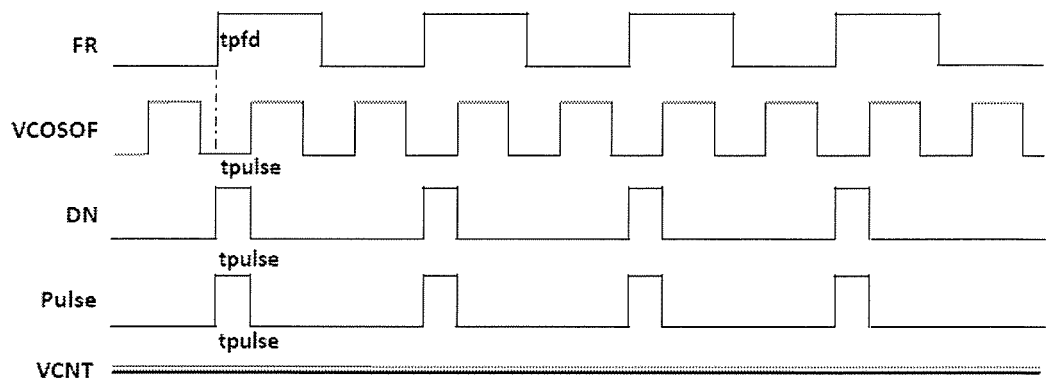
FIG. 6A is another waveform diagram showing an operation in a case of a loop made of only a down signal DN and showing a case of a constant voltage control signal VCNT.
Figure 6B:
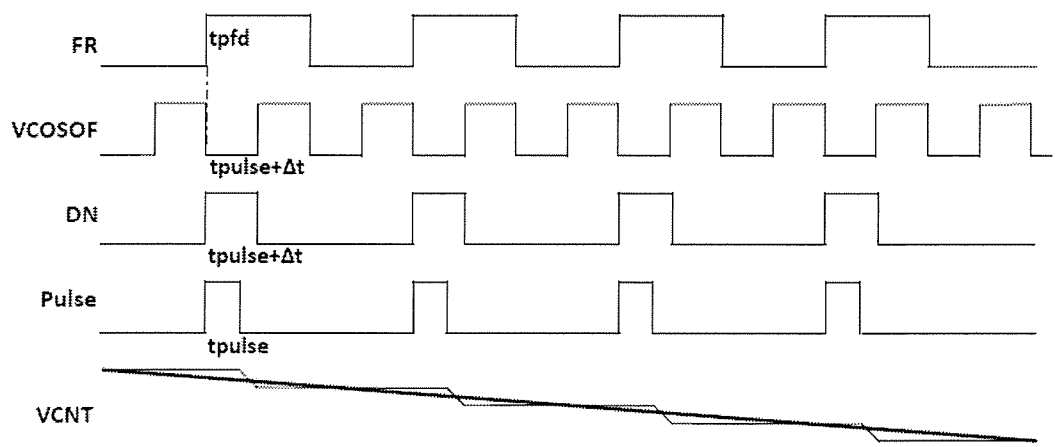
FIG. 6B is another waveform diagram showing an operation in a case of a loop made of only a down signal DN and showing a case of a decreasing voltage control signal VCNT.
Figure 6C:
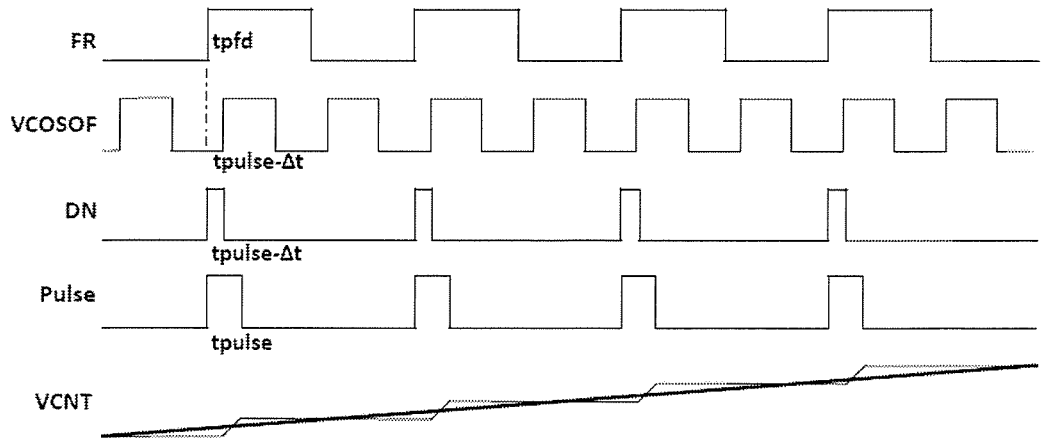
FIG. 6C is another waveform diagram showing an operation in a case of a loop made of only a down signal DN and showing a case of an increasing voltage control signal VCNT.

FIG. 6 is another waveform diagram showing an operation in a case of a loop made of only the down signal DN. A difference of FIG. 6 from FIG. 5 is that the FD of FIG. 5 changes to a VCO source oscillation (VCOSOF). FIG. 6A shows a case of a constant voltage control signal VCNT, FIG. 6B shows a case of a decreasing voltage control signal VCNT, and FIG. 6C shows a case of an increasing voltage control signal VCNT.

As shown in each FIG. 6, the same operation is achieved even when the FD is replaced with the VCO source oscillation (VCOSOF). Therefore, the frequency division circuit DIV can be removed from the feedback loop of the phase locking circuit PLL1.

The phase locking circuit PLL1 and the Ring oscillator are formed in a semiconductor chip in which the semiconductor product for energy harvest is formed. When the first example is applied, the phase locking circuit PLL1 using the Ring oscillator having the favorable area efficiency can also achieve very low consumed electric current that is considered to be important for the application to the energy harvest.

The consumed electric current of the phase locking circuit PLL1 can be reduced to be 30% lower than that of the phase locking circuit PLL of FIG. 1. Since the consumed electric current of the phase locking circuit can be reduced by 30% even without the area overhead, this circuit is applicable to the semiconductor product for energy harvest.

Second Example

Figure 7:
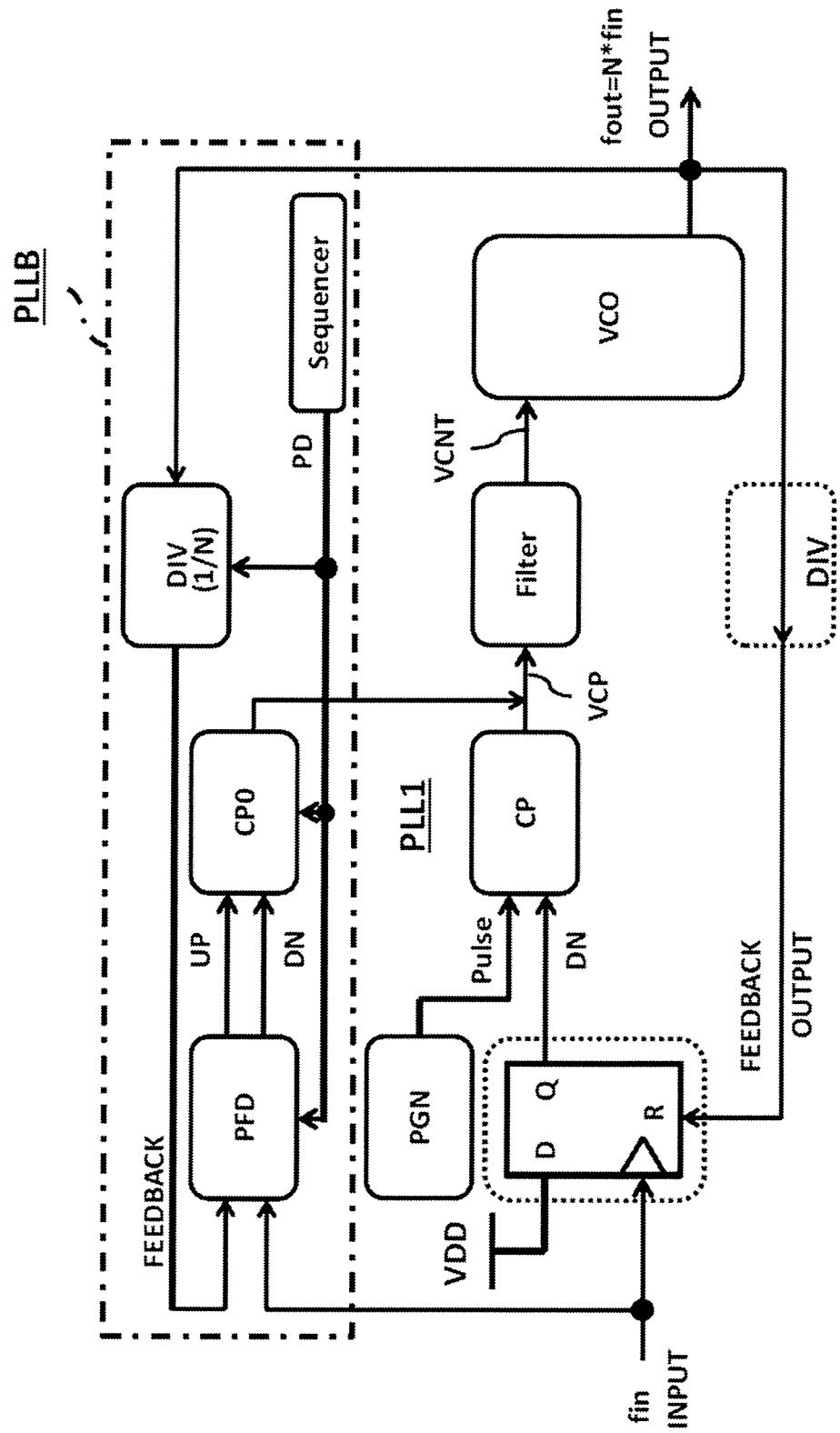
FIG. 7 is a block diagram showing a configuration example of a phase locking circuit according to a second example.

In the phase locking circuit PLL1 of the first example, it is necessary to differently perform a pull-in frequency process after start up. The second example is described in a configuration example of a phase locking circuit PLL2 in a case of additional preparation of a different loop (PLLB) for the pull-in frequency process to the phase locking circuit PLL1 of the first example. FIG. 7 is a block diagram showing a configuration example of the phase locking circuit according to the second example.

As shown in FIG. 7, the phase locking circuit PLL2 has the configuration added with the different loop PLLB for the pull-in frequency process. The different loop PLLB includes a phase-frequency comparison circuit PFD, a charge pump circuit CP0, a frequency division circuit DIV (Divider) and a sequencer. The sequencer is made of a counter circuit, a lock detection circuit, a pull-in frequency detection circuit and others.

The phase-frequency comparison circuit PFD in the different loop PLLB compares a phase and a frequency between the reference input signal INPUT having the reference frequency fn and the feedback signal FEEDBACK output from the frequency division circuit DIV, and generates the up signal UP or the down signal DN so that the phase and the frequency of the feedback signal FEEDBACK and the phase and the frequency of the input signal INPUT match with each other. The charge pump circuit CP0 generates a voltage output signal VCP based on the up signal UP or the down signal DN, and outputs this signal to the loop filter circuit Filter. The frequency of the output signal OUTPUT of the voltage-controlled oscillation circuit VCO is divided to be 1/N times the frequency by the frequency division circuit DIV, and is output as the feedback signal FEEDBACK to the phase-frequency comparison circuit PFD.

Third Example

Figure 8:
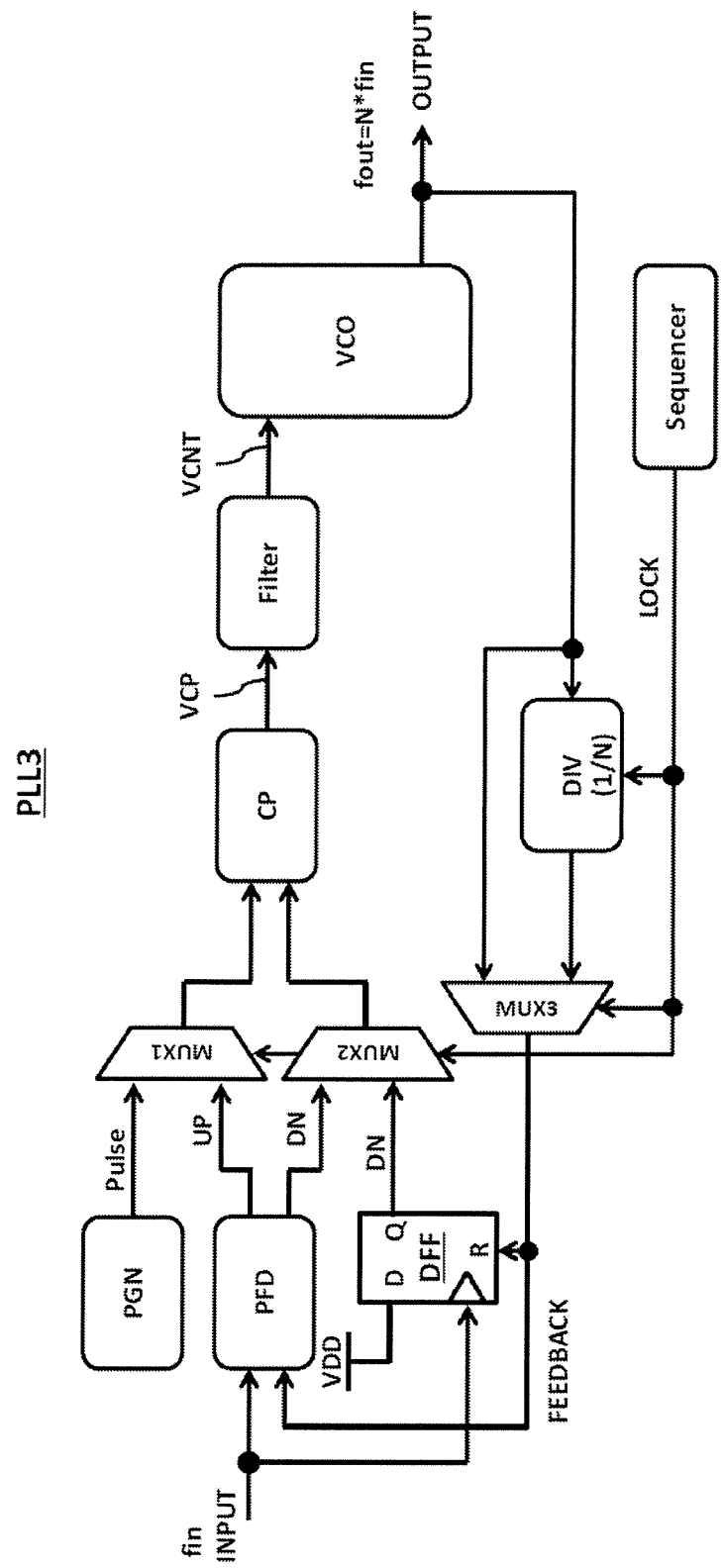
FIG. 8 is a block diagram showing a configuration example of a phase locking circuit according to a third example.

In the phase locking circuit PLL2 of the second example, it is necessary to prepare two charge pump circuits CP and CP0, and therefore, the area of the phase locking circuit PLL2 increases. The third example is a configuration example of a phase locking circuit PLL3 achieving the pull-in frequency process using circuit blocks, the number of which is as small as possible, because signals are switched by a plurality of multiplexers "MUX". FIG. 8 is a block diagram showing a configuration example of the phase locking circuit according to the third example.

As shown in FIG. 8, the phase locking circuit PLL3 is provided with three multiplexers MUX1, MUX2 and MUX3. As the up signal of the charge pump circuit CP (Charge Pump), the first multiplexer MUX1 supplies either selected one of the pulse signal Pulse of the pulse generation circuit PGN and the up signal UP of the phase-frequency comparison circuit PFD. As the down signal of the charge pump circuit CP (Charge Pump), the second multiplexer MUX2 supplies either selected one of the down signal DN of the phase-frequency comparison circuit PFD and the down signal DN of the delay flip flop DFF. As the feedback signal FEEDBACK, the third multiplexer MUX3 supplies either selected one of the output signal OUTPUT of the voltage-controlled oscillation circuit VCO and the output signal of the frequency division circuit DIV.

For example, in accordance with the first level of the lock signal LOCk, the first multiplexer MUX1 selects the pulse signal Pulse, the second multiplexer MUX2 selects the down signal DN of the delay flip flop DFF, and the third multiplexer MUX3 selects the output signal OUTPUT of the voltage-controlled oscillation circuit VCO. On the other hand, in accordance with the second level of the lock signal LOCk, the first multiplexer MUX1 selects the up signal UP of the phase-frequency comparison circuit PFD, the second multiplexer MUX2 selects the down signal DN of the phase-frequency comparison circuit PFD, and the third multiplexer MUX3 selects the output signal of the frequency division circuit DIV.

Fourth Example

Figure 9:
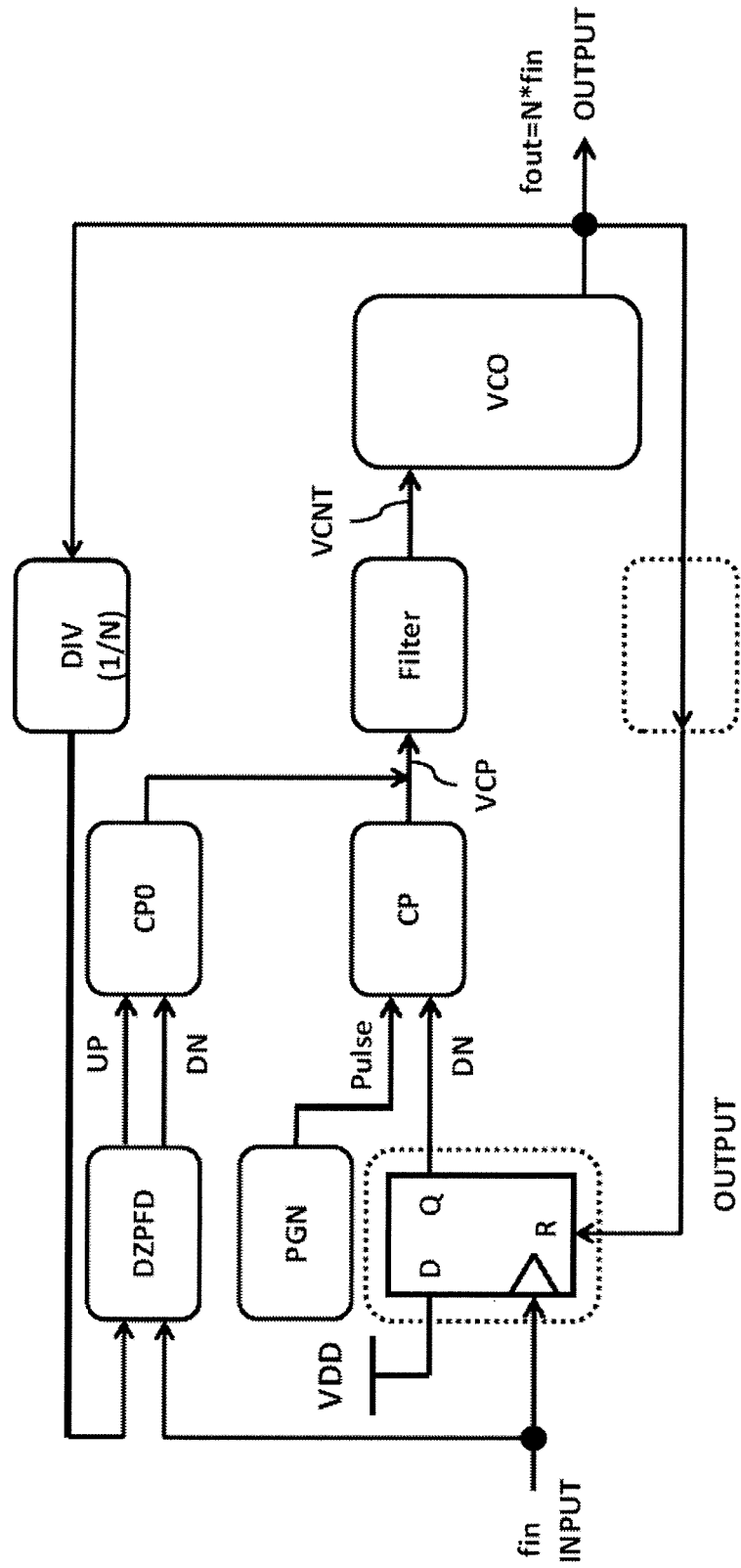
FIG. 9 is a block diagram showing a configuration example of a phase locking circuit according to a fourth example.

When the multiplying factor or others changes after the phase locking of the phase locking circuits PLL2 and PLL3 in the third example, the frequency locking is unlocked (canceled). In the fourth example, a configuration example achieving the frequency locking in background by using a dead-zone phase-frequency comparison circuit DZPFD (Dead Zone PFD) will be described. FIG. 9 is a block diagram showing a configuration example of a phase locking circuit according to the fourth example.

As shown in FIG. 9, the phase locking circuit PLL4 includes the dead-zone phase-frequency comparison circuit DZPFD supplying the up signal UP or the down signal DN to the charge pump circuit CP0. To the dead-zone phase-frequency comparison circuit DZPFD, the input signal INPUT and the output signal of the frequency division circuit DIV dividing the frequency of the output signal OUTPUT of the voltage-controlled oscillation circuit VCO are input. The dead-zone phase-frequency comparison circuit DZPFD has a dead zone in a region having the small phase difference between the phase of the input signal INPUT and the phase of the output signal of the frequency division circuit DIV. In the phase locking circuit PLL4, the frequency locking is achieved by usage of the dead zone of the dead-zone phase-frequency comparison circuit DZPFD.

In the foregoing, the present invention made by the present inventors has been concretely described on the basis of the embodiments. However, it is needless to say that the present invention is not limited to the foregoing embodiments and examples, and various modifications can be made.

What is claimed is:

1. A phase locking circuit comprising:
    a phase comparator;
    a pulse generation circuit;
    a charge pump circuit;
    a loop filter circuit; and
    a voltage-controlled oscillator,
    wherein the phase comparator samples a first level in synchronization with a received reference clock, and generates a first signal to be initialized to a second level that is different from the first level by using a feedback clock, and
    the pulse generation circuit generates a second signal in accordance with the reference clock, and controls a phase of an output signal of the voltage-controlled oscillator to be the feedback clock to have a predetermined value by inputting the first signal and the second signal as a control voltage to the voltage-controlled oscillator through the charge pump circuit and the loop filter circuit.

2. The phase locking circuit according to claim 1, wherein the phase comparator includes a delay flip flop, the delay flip flop has:
    a clock terminal to which the reference clock is input;
    an input terminal to which a power-supply potential of the first level is input;
    an output terminal from which the first signal is output to the charge pump circuit; and
    a reset terminal to which the output signal of the voltage-controlled oscillation circuit is input as the feedback clock.

3. The phase locking circuit according to claim 2, wherein the reference clock is an output clock of a ring oscillator.

4. The phase locking circuit according to claim 3, wherein the phase locking circuit and the ring oscillator are formed in a semiconductor chip.

5. The phase locking circuit according to claim 4, a semiconductor product for energy harvest is formed in the semiconductor chip.

* * * * *